(12) United States Patent
Schroder et al.

(10) Patent No.: US 6,965,629 B2
(45) Date of Patent: Nov. 15, 2005

(54) METHOD AND APPARATUS FOR INITIATING A PULSED ARC DISCHARGE FOR NANOPOWDER SYNTHESIS

(75) Inventors: Kurt A. Schroder, Coupland, TX (US); Douglas Keith Jackson, Austin, TX (US); Stephen James Schmidt, Round Rock, TX (US)

(73) Assignee: Nanotechnologies, Inc., Austin, TX (US)

( * ) Notice: Subject to any disclaimer, the term of this patent is extended or adjusted under 35 U.S.C. 154(b) by 0 days.

(21) Appl. No.: 10/862,548

(22) Filed: Jun. 7, 2004

(65) Prior Publication Data

US 2005/0062430 A1 Mar. 24, 2005

Related U.S. Application Data

(60) Provisional application No. 60/505,644, filed on Sep. 24, 2003.

(51) Int. Cl.$^7$ .............................. H05B 7/22; G01G 1/02
(52) U.S. Cl. ....................... 373/62; 219/121.59; 423/26
(58) Field of Search .................................. 373/2, 60–62; 219/121.11, 121.36, 121.43, 121.47, 121.51, 121.52, 121.59; 423/26, 263, 335, 592.1; 312/111.21; 204/164

(56) References Cited

U.S. PATENT DOCUMENTS

| | | | |
|---|---|---|---|
| 2,490,087 A | 1/1949 | Pakala | 250/27.5 |
| 2,594,851 A | 4/1952 | Bertele | 313/29 |
| 2,907,905 A | 10/1959 | Humphrey | 313/32 |
| 4,054,813 A | 10/1977 | Agnoux et al. | 313/325 |
| 4,261,412 A * | 4/1981 | Soykan et al. | 164/495 |
| 4,604,554 A | 8/1986 | Wootton | 315/330 |
| 4,886,547 A * | 12/1989 | Mizukami et al. | 75/334 |
| 4,897,577 A | 1/1990 | Kitzinger | 315/55 |
| 5,770,022 A * | 6/1998 | Chang et al. | 204/164 |
| 6,392,188 B1 * | 5/2002 | Milani et al. | 219/121.43 |
| 6,472,632 B1 * | 10/2002 | Peterson et al. | 219/121.59 |
| 6,777,639 B2 * | 8/2004 | Schroder et al. | 219/121.59 |

OTHER PUBLICATIONS

International Search Report, dated Apr. 15, 2005, filed in (PCT/US04/30843).

* cited by examiner

*Primary Examiner*—Tu Hoang
(74) *Attorney, Agent, or Firm*—Ross Spencer Garsson; Winstead Sechrest & Minick P.C.

(57) ABSTRACT

A nanopowder synthesis system having an autofuser device which obviates the need for external power switches, and which accommodates repeated discharges (of the order of $10^7$) between ablating electrodes of precursor material at a high repetition rate ($\geq 1$ Hz).

12 Claims, 2 Drawing Sheets

METHOD AND APPARATUS FOR INITIATING A PULSED ARC DISCHARGE FOR NANOPOWDER SYNTHESIS

PRIORITY DATE CLAIM

This patent application claims the benefit of the earlier filing date of the U.S. Provisional Patent Application Ser. No. 60/505,644, which was filed on Sep. 24, 2003, with the named inventors Kurt A. Schroder, Stephen J. Schmidt, and Doug K. Jackson, and which is assigned to the assignee of the present invention.

FIELD OF THE INVENTION

The invention relates generally to processes for synthesizing nanopowders, and more particularly to a nanopowder synthesizing process which requires no external high power switch to effect a high power, pulsed arc discharge between electrodes of precursor material to synthesize nanopowder.

BACKGROUND OF THE INVENTION

In the field of pulsed power, in which electricity is discharged at a high current and high voltage over a very short duration of time, the lack of a reliable switch has prevented widespread commercial implementation of pulsed power to nanopowder synthesis.

One of the techniques for synthesizing nanopowders involves the discharge of a high power pulsed arc between two electrodes, at least one of which is an ablating electrode composed of a precursor material. The high power pulsed arc is created by connecting the electrodes to a high-power, pulsed discharge power supply such as a capacitor bank. During the charging of the power supply, the electrodes are isolated from the charge voltage by means of an external high power, pulsed power switch. If the electrical standoff potential between the electrodes is less than the power supply charge voltage, then a high power, pulsed electrical discharge arc will be created across the electrodes when the external switch is closed.

The production of nanopowder by the above synthesis systems depends upon the reliability of the external pulsed power switch that is used. Prior pulsed power switches include the ignitron offered by Richardson Electronics of LaFox, Ill. as product number NL1488; solid-state switches such as those offered by International Rectifier of El Segundo, Calif. as product number ST3230C18RO, or by Powerex Inc. of Youngwood, Pa. as product number TO20443302; and generally available high power contact switches.

A typical ignitron, such as product number NL1488 offered by Richardson Electronics of LaFox, Ill., is a high power, vacuum mercury switch capable of 50 kV, 75 kA operation, and has an approximate life span of 100,000 operations. Further, the ignitron is comprised of a vacuum canister partially filled with a pool of mercury, two primary electrodes connected to the high-power pulsed-discharge power supply, and a secondary electrode. The secondary electrode and one of the primary electrodes must be connected to a second discharge power supply. In operation, the second discharge power supply is discharged to partially vaporize the mercury and thereby bring the primary electrodes into electrical contact. Thereafter, the high-power pulsed-discharge power supply is discharged to cause a high power pulsed arc between the primary electrodes. The disadvantages of an ignitron include limited life expectancies and a tendency toward catastrophic failures which may result in equipment destruction and mercury contamination.

Solid state switches such as an IGBT (insulating gate barrier transistor) or SCR (silicon controlled rectifier) switches are more reliable than ignitrons. However, solid state switches generally are more costly than the ignitron and have lower power ratings. A lower power rating translates to lower current capacity and/or voltage standoff. As a result, banks of switches in series and/or parallel switch configurations may be needed to switch a pulse comparable to that switched by an ignitron. While a lower power rating may be overcome by using multiple solid state switches in custom configurations, such configurations generally require cooling and sophisticated interconnects to reduce inductive and resistance effects, and ensure load balance. For high-power pulse discharges, a high resistance usually increases the amount of power required to generate a desired pulse, while a high inductance tends to cause an undesirable increase in pulse length.

High power contact or spark gap switches, although simplistic and less expensive than the ignitron or solid state switches, possess the disadvantage that they are generally destroyed after a single use in the high power, pulsed discharge environment described above.

Another disadvantage for systems with external high power switches is that the maximum gap between the electrodes necessary to achieve a desired standoff voltage is determined by the applied voltage. If the distance between electrodes is very small, wear on the production equipment occurs. Further, the electrodes are subjected to abnormal wear. This results in lower nanopowder yield and in equipment down time. If a higher applied voltage system is designed to increase the distance between the electrodes, the switch and production equipment components must be designed to accommodate the higher stand-off voltage. This results in higher costs and decreased system reliability.

One way that prior art systems have attempted to overcome the above disadvantages is through the use of a fuse wire between the electrodes. The gap between electrodes thereupon may be adjusted independent of the applied voltage. In operation, upon the external pulsed power switch being closed, the fuse wire explodes. As a result, a plasma is created that continues to provide an electrically conductive path to allow the pulsed power supply to discharge. The use of a fuse wire, however, requires that a new fuse wire be installed for each discharge. Further, unless the fuse wire is of the same composition as the precursor material of the electrodes, the fuse wire will contaminate the nanopowder which is produced.

The current invention is a nanopowder synthesis system which avoids the use of external high power switches and their attendant disadvantages, and endures repeated discharges (of the order of $10^7$) between electrodes at a high repetition rate ($\geq 1$ Hz) without degradation. This is accomplished by effectively converting the electrodes into a high power switch by using a relatively low energy autofuser that provides a high voltage, high frequency current pulse between the electrodes to initiate a discharge from the main power supply. Although the general understanding in the relevant arts is that using the electrodes of a synthesis system as a switch is undesirable, because the tips of the electrodes are removed due to arc ablation that results in degradation of the switch, the current invention produces nanopowder from the ablated electrode material and indexes the electrodes toward each other to provide consistent operation. The ablation of the electrode tips thus becomes desirable, and initiation of the main power supply discharge across the electrodes occurs by way of a low energy autofuser. Thus, high average power discharges at high repetition rates can be performed reliably.

BRIEF DESCRIPTION OF THE DRAWINGS

While the novel aspects and features of the invention are defined in the appended claims, the principles of the invention, illustrative embodiments, and preferred modes of use are best understood by reference to the Detailed Description Of Preferred Embodiments in conjunction with the following drawings, in which:

DETAILED DESCRIPTION OF PREFERRED EMBODIMENTS

The following terms shall have the definitions given below when used in either lower case or with capitalizations in this specification:

"Stand-Off Voltage" shall mean the voltage necessary to initiate an arc discharge between electrodes.

"High Voltage" shall mean a voltage greater than 500 volts.

"High Power" shall mean power greater than 100 kW.

"Nanopowder" shall mean nanomaterial primarily comprised of nanoparticles which are of a size of 1–500 nanometers (nm).

"Ablative Material" shall mean material removed from a body of precursor material due to the combined effects of heat transfer and mechanical shear caused by plasma velocities.

"Precursor Material" shall mean material which is processed to produce nanopowder.

Figure 1:
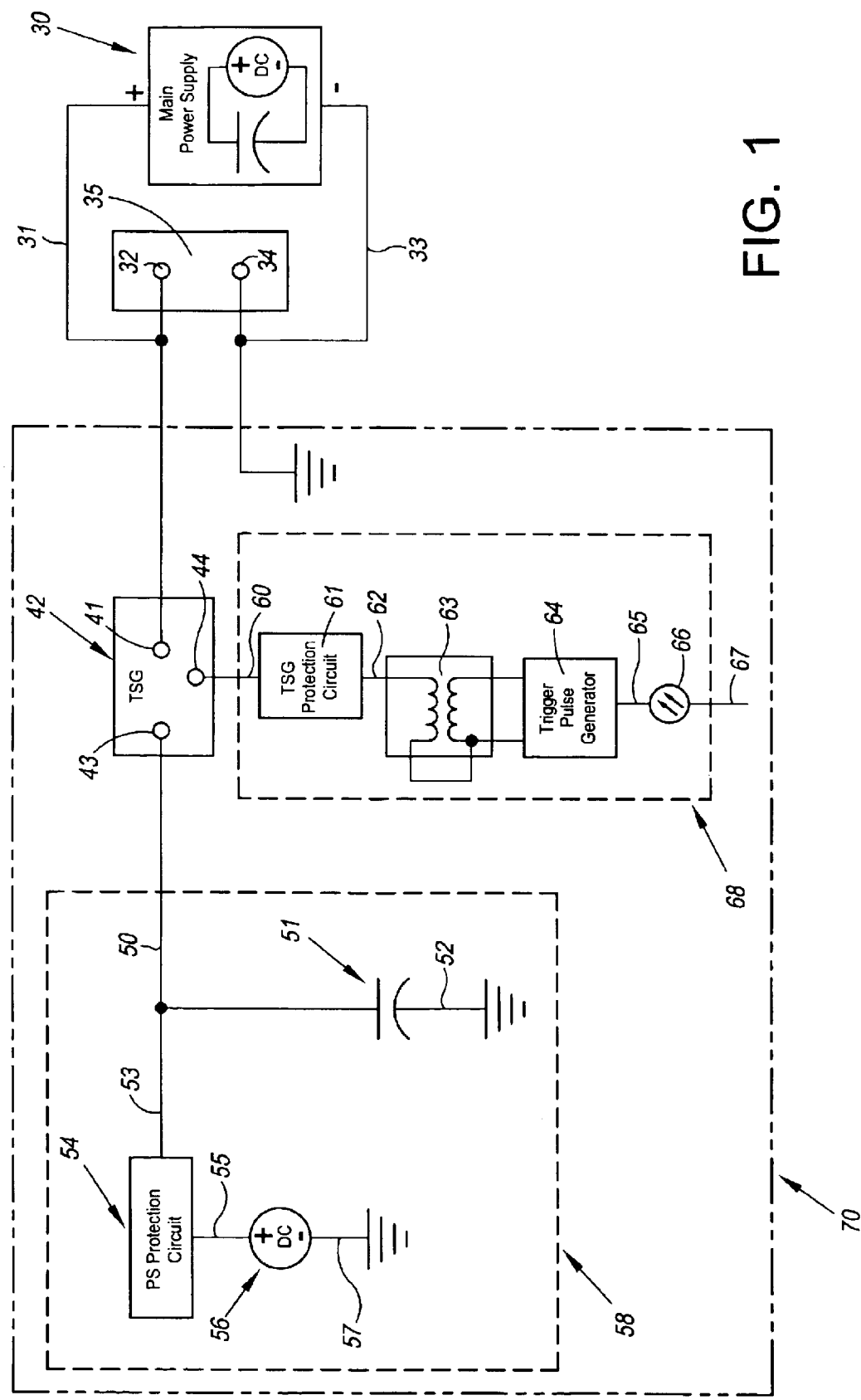
FIG. 1 is an electrical schematic diagram of a first embodiment of the invention with an autofuser circuit connected in parallel with electrodes of precursor material.

Referring to FIG. 1, an embodiment of the present invention is illustrated wherein the positive electrode of a high power, pulsed power supply 30 is connected by way of a conducting wire 31 to an anode electrode 32 of precursor material, and the negative electrode of the pulsed power supply 30 is connected by way of a conducting wire 33 to a cathode electrode 34 which also may be composed of a precursor material. The anode electrode 32 and cathode electrode 34 are located within a reaction chamber 35 that is filled with an inert and/or reactive gas including but not limited to Argon, Nitrogen, Oxygen, or a combination thereof. The selection of the gaseous atmosphere is based upon the nanopowder that is desired.

The anode electrode 32 is connected by way of a conducting wire 40 to a first primary electrode 41 of a triggered spark gap device 42, which has a second primary electrode 43 and a secondary electrode 44.

The triggered spark gap device 42 is commercially referred to as a Trigatron, which is manufactured and sold by Magnavolt Technologies of Plattsburgh, N.Y., and RE Beverly III And Associates of Lewis Center, Ohio.

The first primary electrode 41, second primary electrode 43, and secondary electrode 44 of the triggered spark gap ("TSG") device 42 are housed within a container filled with an inert gas. The second primary electrode 43 also is connected by way of a conducting wire 50 to a positive terminal of an autofuser capacitor 51, which has a rating of approximately 0.03 $\mu$F and 40 kV. The negative terminal of the capacitor is connected by way of a conducting wire 52 to ground. The second primary electrode 43 also is connected by way of conducting wires 50 and 53 to one terminal of an autofuser power supply protection circuit 54, the other terminal of which is connected by way of a conducting wire 55 to the positive terminal of an autofuser charging power supply 56. The negative terminal of autofuser charging power supply 56 is connected by way of a conducting wire 57 to ground.

The autofuser power supply protection circuit 54 is offered commercially in response to custom designs by CKE of Lucernemines, Pa., Spellman High Voltage Electronics Corp. of Hauppuage, N.Y., and Bertan, a Del Power Conversion Group Company of Valhalla, N.Y.

Autofuser capacitor 51, autofuser power supply protection circuit 54, and autofuser charging power supply 56 comprise an autofusing power supply 58 of the present invention. The autofuser charging power supply 56 is a generally available DC high voltage (20–40 kV) power supply that, by way of example, is manufactured and sold by Bertan of Valhalla, N.Y.

Secondary electrode 44 is connected by way of a conducting wire 60 to one terminal of a TSG protection circuit 61, a second terminal of which is connected by way of a conducting wire 62 to a primary winding of a step-up transformer 63. The secondary winding of the step-up transformer 63 is connected to output terminals of a trigger pulse generator 64. An input terminal of the trigger pulse generator 64 is connected by way of a fiber optic cable 65 to an optical signal source 66 having an electrical input line 67.

The TSG protection circuit 61, step-up transformer 63, trigger pulse generator 64, and optical source 66 comprise a trigger circuit 68. The trigger circuit 68 may be purchased commercially in response to custom designs from Magnavolt Technologies of Plattsburgh, N.Y., and from RE Beverly III And Associates of Lewis Center, Ohio.

The TSG device 42, autofusing power supply 58, and trigger circuit 68 comprise an autofuser device 70 of the present invention. The autofuser device 70 must have an impedance sufficiently high to avoid discharging the main pulsed power supply 30 when connected across the anode electrode 32 and cathode electrode 34 (hereafter collectively referred to as "the production electrodes)". The voltage standoff across the production electrodes must be greater than the voltage applied by the charged main pulsed power supply 30. Lastly, the voltage applied by the autofuser device 70 across the production electrodes must maintain a high voltage long enough to initiate a discharge of the capacitor bank of the main pulsed power supply 30.

In operation, the production electrodes are indexed toward each other so that the stand-off voltage across the production electrodes is greater than the charge voltage of the main pulsed power supply 30. Further, the secondary electrode 44 is positioned to have a stand-off voltage with respect to the first primary electrode 41 which is less than the voltage supplied by the step-up transformer 63. The capacitors comprising the main pulsed power supply 30 are charged to a typical voltage of 3–10 kV, while the autofusing power supply 58 charges capacitor 51 to a typical voltage of 30 kV. The first primary electrode 41 and second primary electrode 43 are configured to stand off a voltage which is in the range of 20–40 kV, but which is greater than the difference between the charging voltage of the autofuser capacitor 51 and the charge voltage of the main pulsed power supply. When the optical source 66 is energized to provide an optical signal by way of fiber optic cable 65 to the trigger pulse generator 64, a pulse is issued by the trigger pulse generator 64 which is sensed by the step-up transformer 63 and passed through the TSG protection circuit 61 to the secondary electrode 44. The TSG protection circuit 61 is designed to allow current to pass only one way toward the TSG device 42. In response thereto, a spark occurs across the first primary electrode 41 and secondary electrode 44. The stand-off voltage between the first primary electrode 41 and the second primary electrode 43 thereupon is reduced, and an arc is generated across the two primary electrodes by the discharging autofuser capacitor 51. As a result, the potential of the first primary electrode 41 is increased, and the potential across the production electrodes is increased above the breakdown voltage level. An arc thereupon is created across the production electrodes to discharge the capacitor bank of the main pulsed power supply 30 and produce nanopowder.

The improvements provided by the autofuser device 70 over other known nanopowder synthesis systems using high power external switches is evident. The high power external switch is in effect a high impedance device when open and a low impedance device when closed. With an external high power switch in a nanopowder synthesis system, the electrodes must be positioned close enough so that they present a low impedance to allow an electrical discharge arc formed from the discharge of the main pulsed power supply 30 to jump the gap between the electrodes. In this event, a high power current passes through both the external high power switch and the electrodes. If the gap between the electrodes is large, the electrodes present a high impedance. Thus, once the external power switch is closed, nothing happens because the impedance of the gap is too high.

In a nanopowder synthesis system having no external power switch, but comprising autofuser device 70, the gap between the electrodes is configured to have a high impedance. Thus, when the capacitor bank is charged, the voltage of the capacitor bank will not create an arc discharge. The autofuser device 70 is a relatively low energy device that produces a voltage greater than the standoff voltage between the electrodes. Relative to the autofuser device 70, the electrodes present a low impedance. Upon the autofuser device 70 providing a low power, high voltage discharge, the impedance of the electrodes is effectively reduced so that the main pulsed power supply 30 may discharge. That is, the autofuser device 70 changes the state of the production electrodes from one of high impedance to one of low impedance.

Figure 2:
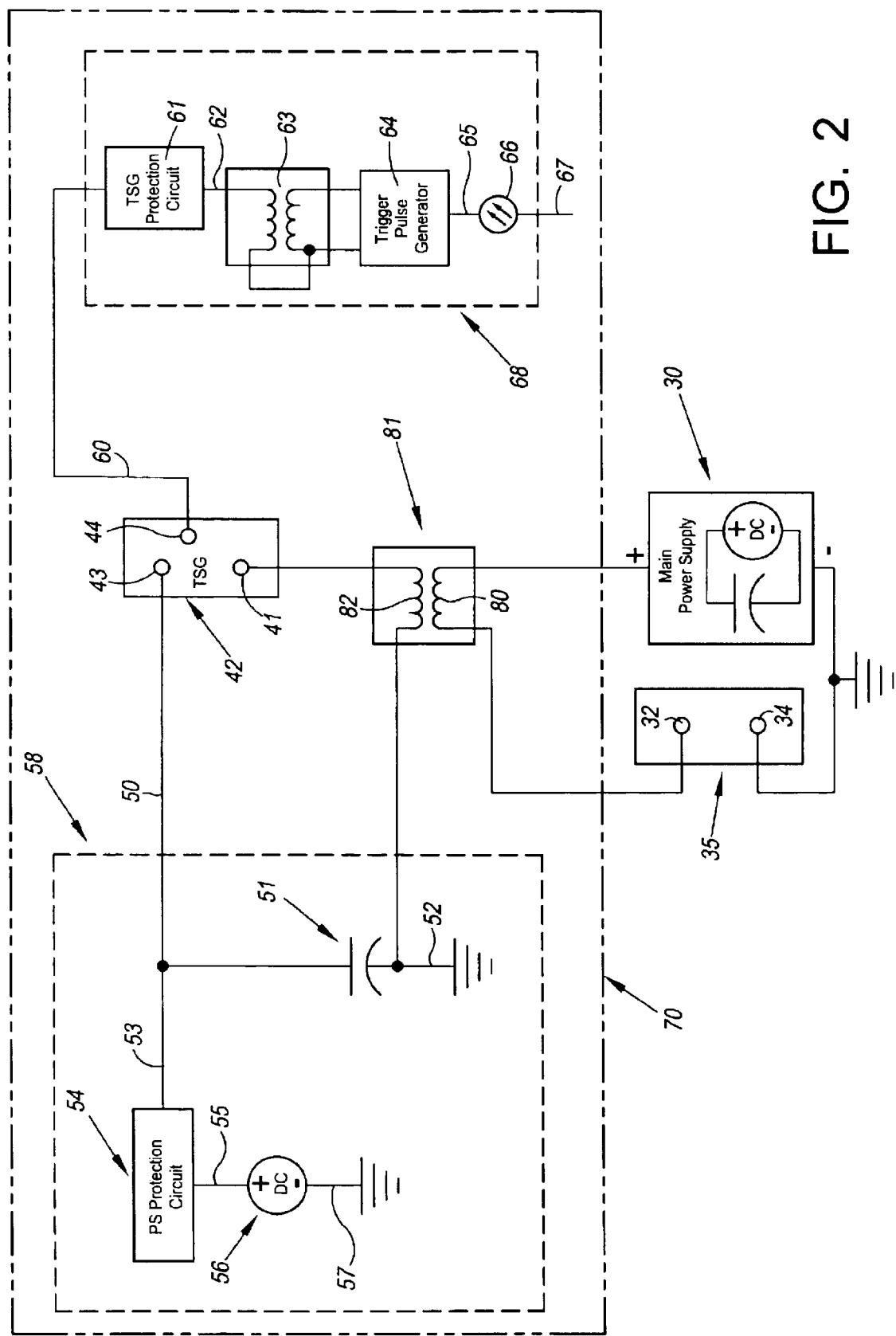
FIG. 2 is an electrical schematic diagram of a second embodiment of the invention with the autofuser circuit of FIG. 1 connected in series with electrodes of precursor material.

Referring to FIG. 2, an alternative embodiment of the invention is illustrated wherein like devices identified in the FIG. 1 description are referred to by like reference numbers. The principal difference between the embodiment of FIG. 2 and that of FIG. 1 is that in FIG. 2, the autofuser device 70 is electrically connected in series with the anode electrode 32, the cathode electrode 34, and the main pulsed power supply 30. More particularly, a secondary coil 80 of a pulse transformer 81 is electrically connected in series between the main pulsed power supply 30 and the anode electrode 32, and a primary coil 82 of the pulse transformer 81 is electrically connected in series between the primary electrode 41 of the TSG device 42 and ground.

In operation, the production electrodes including anode electrode 32 and cathode electrode 34 are designed to stand off the charge voltage of the main pulsed power supply 30, and to have a breakdown voltage less than the voltage (typically 20–30 kV) supplied by the pulse transformer 81. The main pulsed power supply 30 and the autofusing power supply 58 are turned on to be charged. Thereafter, the trigger circuit 68 is initiated by an optical signal from optical source 66 to cause the autofuser capacitor 51 to discharge across the first primary electrode 41 and the second primary electrode 43 of the TSG device 42. As a result, a voltage spike occurs at the primary coil 82 of the pulse transformer 81, and the pulse transformer 81 creates a pulse at the secondary coil 80 to cause the voltage across the production electrodes to increase beyond their breakdown voltage. The main pulsed power supply 30 thereupon discharges to cause nanopowder to be produced in the reaction chamber 35.

It is to be understood that since the pulse transformer 81 is in series with the production electrodes, the embodiment of the invention illustrated in FIG. 2 is better suited for applications involving long pulse lengths of the order of 10 ms or greater. Further, since the current produced by the main pulsed power supply 30 passes through the pulse transformer 81, the pulse transformer 81 should have a low impedance to avoid overheating. In addition, the voltage applied by the autofuser device 70 across the production electrodes must be of a greater magnitude than the charge voltage of the main pulsed power supply 30, and must maintain a high voltage across the production electrodes long enough to initiate a discharge of the main pulsed power supply 30 to produce nanopowder.

Unlike predecessor systems such as the ignitron, solid state switches, and contact switches, the autofuser device 70 has no components with short life spans, but rather may endure up to $10^7$ discharges of the main pulsed power supply 30.

The present invention also accommodates high power, high repetition rate discharges of the order of 1 Hz or more, and life expectancies of $10^7$ discharges or more without requiring active water cooling, sophisticated interconnects, or component replacement. The increased life expectancy is a direct result of the elimination of unreliable external power switches, and the use of the autofuser device 70 which is comprised of relatively low power, reliable components.

The present invention also has been described and illustrated in connection with preferred embodiments having two axially aligned electrodes. It is to be understood that the invention can be applied to any general nanopowder synthesis system which uses a high power discharge across a pair of electrodes, whether both electrodes are made of a precursor material or only a single electrode of the pair is made of a precursor material.

Although the preferred embodiments of the invention have been described in detail, various substitutions, modifications, and alterations can be made without departing from the spirit and scope of the invention as defined in the claims. Further, such descriptions of preferred embodiments are not to be taken as limiting the scope of the present invention as defined by the following claims.

What is claimed is:

1. A synthesizing system for producing nanopowder, which comprises:

a reaction chamber having a gaseous atmosphere and a pair of spaced apart electrodes, at least one of which is a precursor material;

a high power, pulsed power supply electrically connected across said pair of electrodes; and an autofuser device connected to said pair of electrodes to effect a high powered electrical arc discharge from said high power, pulsed power supply across said pair of electrodes to produce said nanopowder.

2. A synthesizing system for producing nanopowder, which comprises:

a reaction chamber having a pair of ablative electrodes of precursor material which are axially aligned but spaced apart in opposing relation, and having a gaseous atmosphere;

a high power, pulsed power supply electrically connected across said pair of ablative electrodes; and an autofuser device electrically connected in parallel with said pair of ablative electrodes to thereby effect a discharge of said high power, pulsed power supply across said pair of ablative electrodes to produce said nanopowder.

3. The synthesizing system of claim 2 above, wherein said autofuser device is comprised of an autofusing power supply, a triggered spark gap device having a first primary electrode, a second primary electrode, and a secondary electrode, with said autofusing power supply being electrically connected to said first primary electrode, a trigger circuit responsive to an external stimulus and electrically connected to said secondary electrode, and a first electrode of said pair of ablative electrodes electrically connected to said second primary electrode.

4. The synthesizing system of claim 2 above, wherein said gaseous atmosphere may be one of an inert gas, a reactive gas, and a combination of said inert gas and said reactive gas.

5. The synthesizing system of claim 3 above, wherein said autofuser device triggers said high power, pulsed power supply repeatedly at a high repetition rate.

6. A synthesizing system for producing nanopowder, which comprises:
a reaction chamber having a pair of ablative electrodes of precursor material which are axially aligned but spaced apart in opposing relation, and having a gaseous atmosphere;
a high power, pulsed power supply electrically connected across said pair of ablative electrodes; and
an autofuser device electrically connected in series with said pair of ablative electrodes to thereby effect a discharge of said high power, pulsed power supply across said pair of ablative electrodes to produce said nanopowder.

7. A method of synthesizing nanopowders in a reaction chamber having a pair of electrodes spaced apart in a gaseous atmosphere, at least one of said pair of electrodes being a precursor material, which comprises:
indexing said pair of electrodes toward each other to create a standoff voltage between said pair of electrodes;
applying a first voltage across said pair of electrodes which is less than said standoff voltage; and
while maintaining said first voltage across said pair of electrodes, applying an electrical pulse to one electrode of said pair of electrodes to cause said standoff voltage to be exceeded and an electrical discharge arc to occur between said pair of electrodes to ablate said at least one of said pair of electrodes to produce said nanopowder.

8. The method of synthesizing nanopowders of claim 7 above, wherein after said step of applying an electrical pulse, each step of said method is repeated until said pair of electrodes is substantially ablated.

9. A method of synthesizing nanopowders in a reaction chamber having a plurality of spaced apart electrodes in a gaseous atmosphere, which comprises:
positioning said plurality of spaced apart electrodes to form a standoff voltage;
applying a first voltage to said plurality of spaced apart electrodes which is less than said standoff voltage; and
while maintaining said first voltage, applying an electrical pulse to one of said plurality of spaced apart electrodes to cause said standoff voltage to be exceeded and an electrical discharge arc to occur to ablate at least one of said plurality of spaced apart electrodes to produce said nanopowder.

10. The method of claim 9 above, wherein after said step of applying an electrical pulse, each step of said method is repeated until said plurality of spaced apart electrodes is substantially ablated.

11. A system for synthesizing nanopowder, which comprises:
a reaction chamber having a pair of indexable electrodes of precursor material in axial alignment and in opposing relation in a gaseous atmosphere, with a first standoff voltage across said pair of indexable electrodes;
pulsed power supply means electrically connected in parallel with said pair of indexable electrodes for applying a first voltage across said pair of indexable electrodes which is less than said first standoff voltage;
trigger spark gap means electrically connected to one of said pair of indexable electrodes, said trigger spark gap means having a pair of primary electrodes and a secondary electrode with a second standoff voltage across said pair of primary electrodes which is greater than an autofuser voltage, and responsive to an electrical pulse for increasing said first voltage above said first standoff voltage to cause an electrical arc discharge to occur between said pair of electrodes to ablate at least one of said pair of indexable electrodes to produce said nanopowder;
trigger circuit means electrically connected to said secondary electrode and responsive to an external stimulus for issuing said electrical pulse to said trigger spark gap means; and
autofusing power supply means electrically connected to said trigger spark gap means for providing said autofuser voltage to said trigger spark gap means.

12. A system for synthesizing nanopowder, which comprises:
a reaction chamber having a pair of electrodes in axial alignment and in opposing relation in a gaseous atmosphere, with a first standoff voltage across said pair of electrodes;
pulsed power supply means having a first terminal electrically connected in series with a first electrode of said pair of electrodes, and applying a first voltage across said pair of electrodes which is less than said first standoff voltage;
pulse transformer means having a primary coil and a secondary coil, with said secondary coil electrically connected in series to a second terminal of said pulsed power supply means and to a second electrode of said pair of electrodes, for generating a pulse to cause said pulsed power supply means to discharge across said pair of electrodes to produce nanopowder;
trigger spark gap means having a pair of primary electrodes and a secondary electrode, with a first of said pair of primary electrodes electrically connected in series with said primary coil, with a second standoff voltage across said pair of primary electrodes which is greater than an autofuser voltage, and responsive to a trigger pulse;
trigger circuit means electrically connected to said secondary electrode and responsive to an external stimulus for issuing said trigger pulse to said trigger spark gap means to reduce said second standoff voltage to allow said autofuser voltage to be discharged across said pair of primary electrodes, thereby causing said pulse transformer means to generate a pulse at said secondary coil and increase voltage across said pair of electrodes to exceed said first standoff voltage; and autofusing power supply means having a third terminal electrically connected to a second of said pair of primary electrodes of said trigger spark gap means, and a fourth terminal electrically connected to said primary coil for providing an autofuser voltage across said pair of primary electrodes.

* * * * *